US012765330B2

(12) United States Patent
Chang et al.

(10) Patent No.: US 12,765,330 B2

(45) **Date of Patent: *Oct. 13, 2026**

(54) PHOTOLITHOGRAPHY METHODS AND RESULTING STRUCTURES

(71) Applicant: Taiwan Semiconductor Manufacturing Co., Ltd., Hsinchu (TW)

(72) Inventors: Chun-Yi Chang, Bade City (TW); Chunyao Wang, Zhubei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 193 days.

This patent is subject to a terminal disclaimer.

(21) Appl. No.: 18/439,340

(22) Filed: Feb. 12, 2024

(65) Prior Publication Data

US 2024/0186142 A1 Jun. 6, 2024

Related U.S. Application Data

(63) Continuation of application No. 17/341,332, filed on Jun. 7, 2021, now Pat. No. 11,935,746.

(60) Provisional application No. 63/159,288, filed on Mar. 10, 2021.

(51) Int. Cl.

| | |
|---|---|
| ***H10P 76/00*** | (2026.01) |
| ***H10D 30/01*** | (2025.01) |
| ***H10P 50/00*** | (2026.01) |
| ***H10P 95/90*** | (2026.01) |

(52) U.S. Cl.

CPC .......... *H10P 76/00* (2026.01); *H10D 30/024* (2025.01); *H10P 50/695* (2026.01); *H10P 95/90* (2026.01)

(58) Field of Classification Search

None

See application file for complete search history.

(56) References Cited

U.S. PATENT DOCUMENTS

| | | | | |
|---|---|---|---|---|
| 6,265,113 | B1 | 7/2001 | Yabe et al. | |
| 8,153,348 | B2 * | 4/2012 | Nemani | H01L 21/3105 430/313 |
| 8,796,666 | B1 | 8/2014 | Huang et al. | |
| 9,012,132 | B2 | 4/2015 | Chang | |
| 9,028,915 | B2 | 5/2015 | Chang et al. | |

(Continued)

FOREIGN PATENT DOCUMENTS

| | | | |
|---|---|---|---|
| CN | 102446813 | A | 5/2012 |
| CN | 104471647 | A | 3/2015 |

(Continued)

*Primary Examiner* — Stephanie P Duclair

(74) *Attorney, Agent, or Firm* — Slater Matsil, LLP

(57) ABSTRACT

As deposited, hard mask thin films have internal stress components which are an artifact of the material, thickness, deposition process of the mask layer as well as of the underlying materials and topography. This internal stress can cause distortion and twisting of the mask layer when it is patterned, especially when sub-micron critical dimensions are being patterned. A stress-compensating process is employed to reduce the impact of this internal stress. Heat treatment can be employed to relax the stress, as an example. In another example, a second mask layer with an opposite internal stress component is employed to offset the internal stress component in the hard mask layer.

20 Claims, 10 Drawing Sheets

(56) References Cited

U.S. PATENT DOCUMENTS

| | | | | |
|---|---|---|---|---|
| 9,093,530 | B2 | 7/2015 | Huang et al. | |
| 9,146,469 | B2 | 9/2015 | Liu et al. | |
| 9,213,234 | B2 | 12/2015 | Chang | |
| 9,223,220 | B2 | 12/2015 | Chang | |
| 9,256,133 | B2 | 2/2016 | Chang | |
| 9,536,759 | B2 | 1/2017 | Yang et al. | |
| 9,548,303 | B2 | 1/2017 | Lee et al. | |
| 9,881,788 | B2 | 1/2018 | Kim et al. | |
| 2008/0157403 | A1 | 7/2008 | Lee et al. | |
| 2010/0276789 | A1* | 11/2010 | Lee | H01L 21/32139 257/629 |
| 2012/0129351 | A1* | 5/2012 | Konecni | H01L 21/02115 438/758 |
| 2013/0267081 | A1 | 10/2013 | Fox et al. | |
| 2013/0334630 | A1 | 12/2013 | Kula et al. | |
| 2020/0370172 | A1 | 11/2020 | Moriya et al. | |

FOREIGN PATENT DOCUMENTS

| | | | |
|---|---|---|---|
| CN | 105575902 | A | 5/2016 |
| CN | 105633011 | A | 6/2016 |
| JP | H11274067 | A | 10/1999 |
| JP | 2014078579 | A | 5/2014 |
| JP | 2020191427 | A | 11/2020 |
| KR | 100792412 | B1 | 1/2008 |
| KR | 102040022 | B1 | 11/2019 |
| TW | 201608053 | A | 3/2016 |

* cited by examiner

PHOTOLITHOGRAPHY METHODS AND RESULTING STRUCTURES

PRIORITY CLAIM AND CROSS-REFERENCE

This application is a continuation of U.S. patent application Ser. No. 17/341,332, filed on Jun. 7, 2021, which claims priority to U.S. Provisional Patent Application No. 63/159,288, filed Mar. 10, 2021, and entitled "Photolithography Methods and Resulting Structures," which applications are incorporated herein by reference.

BACKGROUND

The use of photolithographic techniques in the manufacture of, e.g., integrated circuits is widely employed. Most integrated circuits employ the use of patterned photoresist layer(s) and/or hardmask layer(s) in numerous different process steps, including process steps for patterning and/or etching a layer or layers underlying the photoresist layer and/or hardmask layer. In a convention lithography and etch process, internal stress, and more particularly imbalanced internal stress within the hardmask layer can cause the patterned hardmask to deform from the desired pattern. This deviation from the desired pattern can then be transferred to the underlying layer or layers during the subsequent etch process, resulting in a loss of fidelity to the desired pattern and a loss of resolution.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
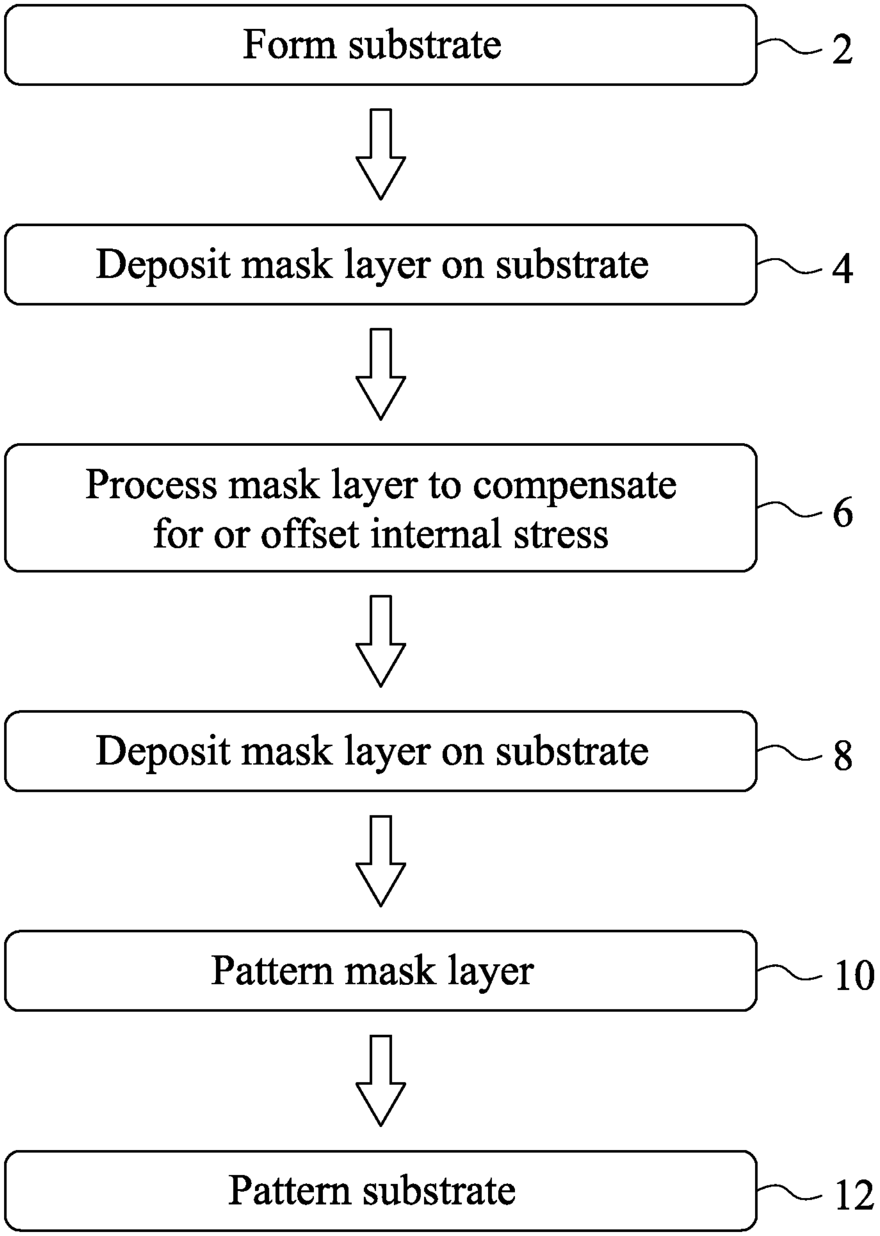
FIG. 1 illustrates a flow chart describing a representative embodiment of the process described herein.

Further details of one embodiment of the process illustrated in FIG. 1 are provided with reference to FIGS. 2*a* through 2*f* and FIGS. 3*a* through 3*c*.

Further details of another embodiment of the process illustrated in FIG. 1 are provided with reference to FIGS. 4*a* through 4*h* and FIGS. 5*a* through 5*c*.

FIGS. 6*a* through 6*f* illustrates a representative embodiment for forming a semiconductor device such as a FinFET.

FIGS. 7*a* through 7*d* and 8*a* through 8*b* illustrate respective representative embodiments for forming a semiconductor device such as a Gate All Around (GAA) transistor.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a flow chart describing a representative embodiment of the process described herein. Beginning with step 2 of FIG. 1, a substrate is formed. In this context, forming a substrate can encompass a host of methods, steps, and processes both conventional and new for preparing a substrate. A representative application of the methods and structures described herein is in the formation of a semiconductor device such as an integrated circuit. In such an application, the step 2 of forming a substrate could include depositing one or more layers on a silicon or similar wafer, which layers are to be subsequently patterned, etched, selectively implanted with dopants, or otherwise processed in some manner. The wafer itself and the layer or layers to be processed can be and include a dielectric layer, a conductive layer, or a semiconductor layer—the exact electrical and mechanical nature of the wafer and layers not being directly relevant to the lithography methods described herein. In some embodiments the wafer itself will be processed (etched, selectively implanted, or the like) using the methods described herein, whereas more frequently the methods described herein would be employed during the processing of one or more layers deposited (or otherwise formed) on the wafer. One skilled in the art will recognize that numerous layers are serially formed and processed during the manufacture of an integrated circuit or other semiconductor device. Hence, the steps illustrated in FIG. 1 will likely be repeated numerous times, with each time the substrate including additional layers to be processed, during the manufacture of a typical device or circuit.

Continuing on to step 4 of FIG. 1, a mask layer is deposited on the substrate. Mask layers are known in conventional semiconductor arts. In some instances, a mask layer is formed of a photoresist material, generally a polymer that is photo-sensitive—meaning that one or more properties of the material change when exposed to a light source. In other instances, a mask layer is a so-called hardmask layer that can itself be patterned using, e.g., a photoresist layer on top of it and then once patterned the hardmask layer is used as a masking layer for etching or otherwise processing an underlying layer or layers. Although not illustrated, one skilled in the art will recognize that one or more additional layers, such as a bottom anti-reflective coating (BARC) layer, a buffer layer, or the like, could be deposited on the substrate before depositing the mask layer thereon.

Silicon oxide and silicon nitride, sometimes referred to herein as oxide and nitride, respectively, are two examples of conventionally used hardmask layers, although the present disclosure is not intended to be limited to these examples. For instance, in some applications both an oxide layer and a nitride layer might be used in tandem for a particular lithography step. In other applications, a silicon-oxy-nitride layer might be employed as a hardmask. In still other applications, a metal-containing hardmask layer might be employed, such a TiN, or an oxide of Ti, W, Zr, and the like. One skilled in the art will recognize, once informed by the teaching herein, other materials that can be employed as a hardmask layer. Additionally, throughout this description, the terms mask layer, hard mask layer, and hardmask layer will be used interchangeably unless the context requires otherwise.

As an artifact of the material employed and the deposition process, and possibly also of the underlying materials and topography, the mask layer has an internal stress associated with it. Temperature fluctuations during processing can exacerbate the internal stress, particularly when the mask layer and the underlying layer(s) have a mismatch in their respective coefficient of thermal expansion (CTE). While this internal stress is not, per se, problematic when the mask layer is deposited, once the mask layer is patterned (as described more fully below with respect to steps 8 and 10 of FIG. 1), the internal stress can cause the patterned mask layer to twist or distort—which in turn causes a reduction in fidelity of the desired pattern to be imposed upon the underlying substrate. This phenomenon becomes increasingly problematic as minimum feature sizes for integrated circuits and the like drive deep into the sub-micron range. At such feature sizes, even nominal distortion of the mask layer can result in unacceptable results in the patterning process.

Step 6 of FIG. 1 represents a step of processing the mask layer to compensate for internal stress. After the hard mask layer has been deposited on the substrate, the hardmask layer is processed to compensate for, reduce, or otherwise adjust internal stress. One example of such a process is a thermal treatment, as will be described in greater detail with regard to FIGS. 2*a* through 2*f* and FIGS. 3*a* through 3*c*. Another example, described in greater detail with regard to FIGS. 4*a* through 4*h* and FIGS. 5*a* through 5*c*, involves depositing a stress-compensating layer on the mask layer to offset (counteract) the effects of the internal stress.

Continuing on in the process, the mask layer is then itself patterned, as represented by step 10 of FIG. 1. In some embodiments, a photoresist layer is deposited on the mask layer and the photoresist layer is patterned by, e.g., exposing the photoresist layer to a source light that is passed through a photomask, as is known in the art. The exposed photoresist layer is then developed to pattern it, as is also known. This patterned photoresist layer then acts as a mask layer for the underlying mask layer, typically a hard mask layer such as described above. Using the patterned photoresist layer as a mask, the mask layer of interest can be patterned by, e.g., Currently amended exposing the mask layer to an etchant that removes the portions of the mask layer that are left exposed by the patterned photoresist layer, while those portions that are covered by the patterned photoresist layer are not removed by the etchant.

Finally, step 12 of FIG. 1 represents patterning the substrate through the patterned mask layer. As used herein, the term "patterning" the substrate should be broadly construed to include etching the substrate, as described more fully below, but also to include other processes such as selectively doping regions of the substrate exposed by the patterned mask layer, selectively depositing (e.g., electro-plating, electroless-plating, epitaxial growth, and the like) material on the substrate, and the like.

Further details of one embodiment of the process illustrated in FIG. 1 are provided with reference to FIGS. 2*a* through 2*f*. Starting with FIG. 2*a*, a representative substrate 20 is shown including an underlying structure 22 and a layer 24 to be processed. Underlying structure 22 schematically represents a wafer or other structural support, if any, and any layers, materials, or structures formed on, in, or over the support. In other words, underlying structure 22 is intended to represent any structure upon which layer 24 has been deposited or otherwise formed. In the state of manufacture illustrated by FIG. 2*a*, mask layer 26 has been deposited on substrate 20. As an example, FIG. 2*a* could represent a portion of an integrated circuit during an intermediate stage of the manufacturing process. In this non-limiting example, layer 24 could be a polysilicon layer deposited thickness in the range of about 600 Å to about 1000 Å. Mask layer 26, often called a hardmask layer in this context, is for example a layer of silicon oxide deposited, likewise deposited to a thickness of from about 600 Å to about 1000 Å. It is not necessary that mask layer 26 and underlying layer 24 be of the same thickness, and oftentimes this will not be the case. Rather, as will be appreciated by those skilled in the art, the thickness of mask layer 26 can be determined by considering not just the thickness and material of the underlying layer, but also the material used for the mask layer itself, the type of patterning to be performed, the ability of mask layer 26 to withstand the subsequent processing (such as to withstand being etched away by an etchant used to pattern underlying layer 24), and a host of other factors. Yet another factor to consider is whether mask layer 26 will be removed after layer 24 is patterned, will remain as simply an artifact of the process, or will remain and serve some function in the ultimate product (e.g., acting as an anti-reflective coating for a subsequent photolithography step, or as an insulator, or the like). As such, the specific ranges provided herein are intended as a guide and not as a limitation or restriction on the full extent of the scope of the disclosure herein.

As was discussed above, mask layer 26 has an inherent internal stress when it is deposited which can cause twisting and distortion when fine features are patterned into the layer. After mask layer 26 is deposited, it is subjected to a process to compensate or offset the internal stress, as represented by step 6 of FIG. 1. In one embodiment, the compensation process is a thermal treatment, as schematically represented by arrows 25 in FIG. 2*a*. Further details of an exemplary such process will be provided below with reference to FIGS. 3*a* through 3*c*.

Figures 2A, 2B, 2C, 2D, 2E, 2F:
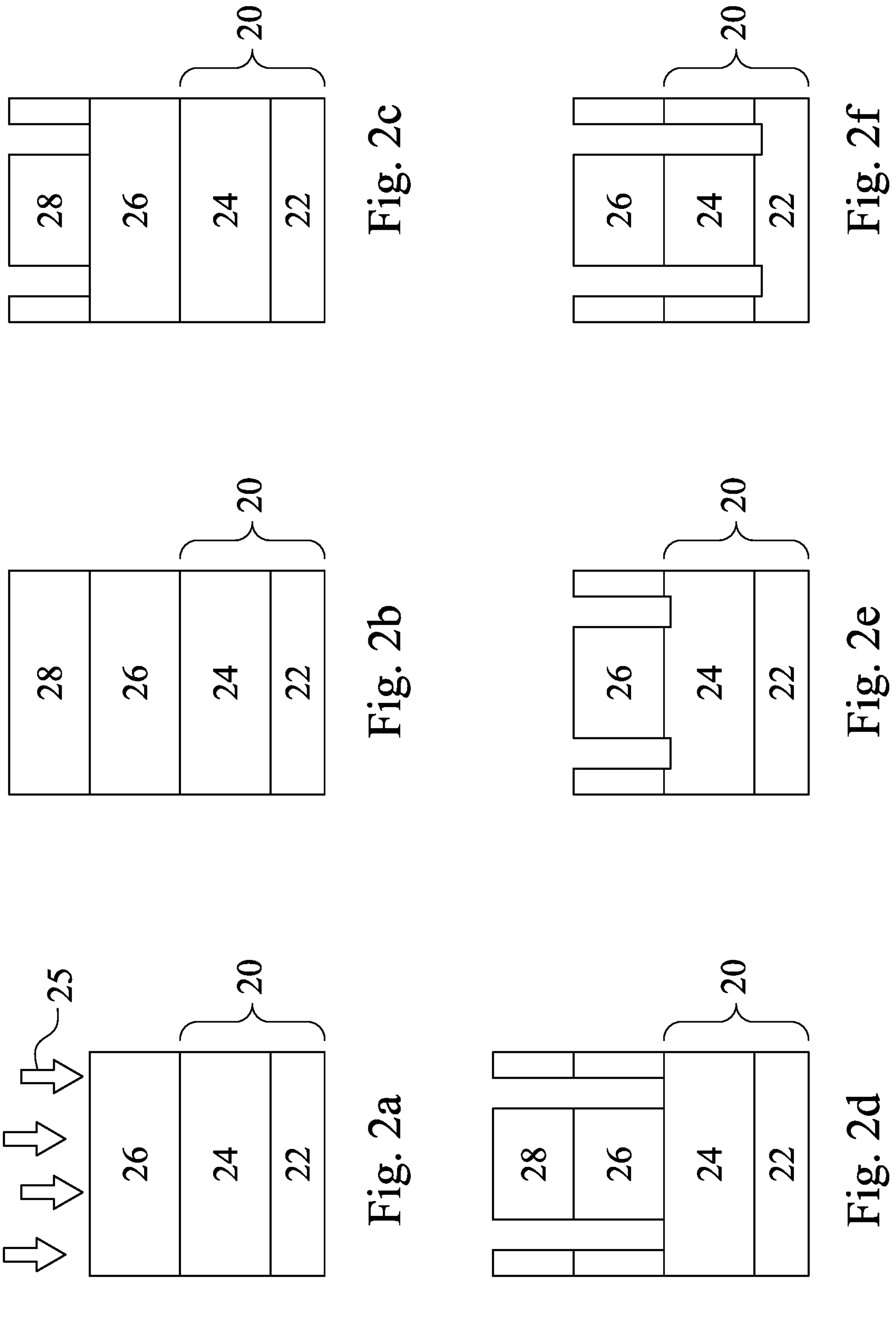

Continuing with the process, FIG. 2*b* illustrates the stage in manufacturing where a layer of photoresist material 28 has been deposited on mask layer 26. One skilled in the art will be familiar with photoresist materials and their application and use, and hence details of same are not included herein for the sake of brevity. The teachings herein are applicable across the broad range of photoresists including commercially available photoresists, positive resists, negative resists, and the like. In the exemplary embodiment illustrated in FIGS. 2*a* through 2*f*, photoresist layer 28 is deposited using conventional techniques to a thickness of, for example, from about 500 Å to about 2000 Å. Next, as illustrated in FIG. 2*c*, photoresist layer 28 is patterned. This can be done using known photolithographic techniques, for example, or perhaps using ion beam or electron beam lithography or other such techniques.

FIG. 2*d* illustrates the device in the stage of manufacturing when mask layer 26 is patterned using the patterned photoresist layer 28 as a mask. In the embodiment wherein mask layer 26 is silicon oxide, for instance, a wet etch such as by hydrofluoric acid (HF), or a buffered oxide etch solution, or the like can be employed. Alternatively, a dry etch such as a plasma etch using $CF_4$, $SF_6$, $NF_3$, or the like could be employed. Other alternative etch processes and etchants can be derived through routine experimentation once informed by the present disclosure.

In FIG. 2*e*, remaining photoresist layer 28 has been removed after mask layer 26 has been patterned. Depending upon the composition and materials of the layers and the specifics of the etch process, some or all of photoresist layer 28 might be removed during the patterning step illustrated by FIG. 2*d*. In most instances, however, some of photoresist layer 28 will remain. This remaining layer can be removed, such as by stripping, ashing, oxygen plasma, and the like. In yet other embodiments, remaining photoresist layer 28 can be left on patterned mask layer 26 and removed in some subsequent process step (not illustrated).

Next, as illustrated in FIG. 2*f*, layer 24 is patterned using mask layer 26 as a pattern mask. Because mask layer 26 was subjected to the stress compensation process (step 6 of FIG. 1) and hence had the internal stress inherent therein eliminated or at least greatly reduced, once patterned mask layer 26 is not subject to twisting and distortion and hence provides greater resolution and fidelity to the desired pattern when patterning layer 24. In the embodiment wherein layer 24 is a polysilicon layer, various etch processes are known, such as a wet etch with, e.g., a $HNO_3$-based chemistry, a dry etch using, e.g., a fluorine-based or chlorine-based chemistry, and the like. While the particulars of the polysilicon etch process are not directly relevant to the present teaching, one skilled in the art will recognize that it is desirable to have a relatively high degree of etch selectivity between the layer 24 (such as polysilicon in this representative embodiment) and the mask layer (such as silicon oxide in this representative embodiment) in order to maintain the mask layer's function.

After the step illustrated by FIG. 2*f*, processing can continue, such as by in some instances removing mask layer 26 and subsequently depositing one or more additional layers over patterned layer 24. In yet other embodiments, mask layer 26 may remain and be incorporated into the resulting structure. Additionally, while FIG. 2*f* illustrates the patterning of layer 24 to be an etch process, as addressed above, the term patterning used herein is intended to be interpreted broadly enough to encompass numerous processes, including etching, selectively doping, selectively growing material on, and the like.

Figure 3A:
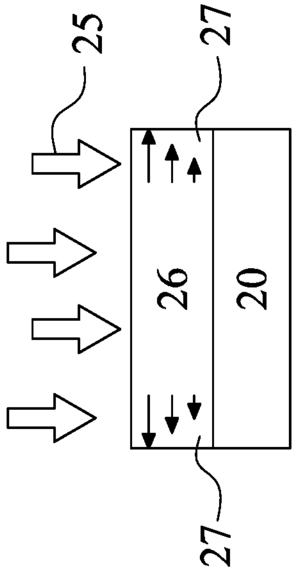
Figure 3B:
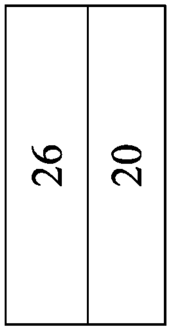
Figure 3C:
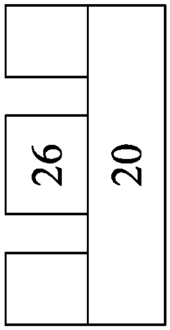

Turning now to FIGS. 3*a* through 3*c*, further details are provided for this embodiment of the stress compensation process. In this view, layer 24 and underlying structure 22 are not shown separately, but rather are illustrated collectively by substrate 20. FIG. 3*a* illustrates the state wherein mask layer 26 is deposited on substrate 20. In this representative embodiment, mask layer 26 is silicon oxide and as deposited mask layer 26 has an internal stress. For a typical oxide mask layer deposited in a thickness range of from about 600 Å to about 1000 Å, the internal stress could be a compressive stress of around 300 MPa, for example. This internal stress is schematically illustrated by arrows 27 in FIG. 3*a*. Also schematically illustrated by arrows 25 in FIG. 3*a* is a thermal process to which mask layer 26 is subjected. In one representative embodiment, mask layer 26 is subjected to a rapid thermal anneal (RTA) process, whereby the layer (and the device of which it forms a part) is taken rapidly from room temperature (or near room temperature) to an elevated temperature for a relatively short period of time. For instance, in an exemplary RTA process, the device could be quickly subjected to a temperature of from about 600° C. to about 800° C. for a period of about 30 seconds to one minute. In another representative embodiment, mask layer 26 (and the device of which it forms a part) is placed within a furnace and subjected to a slower ramp up and ramp down of temperature. For example, an embodiment furnace anneal process could take the device to a temperature of from about 500° C. to about 550° C. for a period of three to five hours. Optionally, an initial pre-heating process at a lower temperature for a brief period could first be employed prior to ramping the device to the target temperature. As yet another example, a combination of a RTA and a furnace anneal could be employed.

Without being tied to any particular theory or underlying model, it is believed that the atoms of mask layer 26 will migrate to relatively stable positions as a result of the thermal process. Because of this, the internal stress of the hard mask layer is released and eliminated entirely or significantly reduced. The result, is illustrated in FIG. 3*b*, wherein the compressive stress (arrow 27 in FIG. 3*a*) is removed from mask layer 26. Then, as illustrated in FIG. 3*c*, when mask layer 26 is subsequently patterned (using, e.g., the process steps illustrated in FIGS. 2*b* through 2*e*), the absence of internal stress means that the patterned mask layer 26 does not twist or distort or otherwise suffer from degradation of resolution and pattern fidelity that would otherwise arise.

Figure 4A:
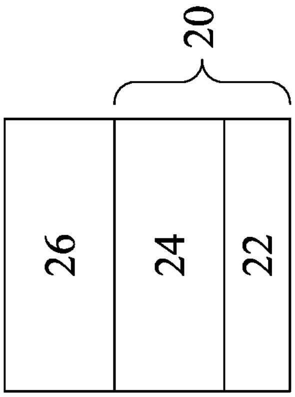

Another embodiment process flow will now be described with reference to FIGS. 4*a* through 4*h*. The structure illustrated in FIG. 4*a* is the same intermediate structure as that shown in FIG. 2*a*—a substrate including an underlying structure 22 upon which has been deposited a layer 24 to be processed having a mask layer 26 formed thereon. As in the example above, layer 24 is a polysilicon layer deposited to a thickness in the range of about 600 Å to about 1000 Å, and mask layer 26 is a silicon oxide layer of about 600 Å to about 1200 Å in thickness. Mask layer 26 has an internal stress when it is deposited which can cause twisting and distortion when fine features are patterned into the layer.

Figure 4B:
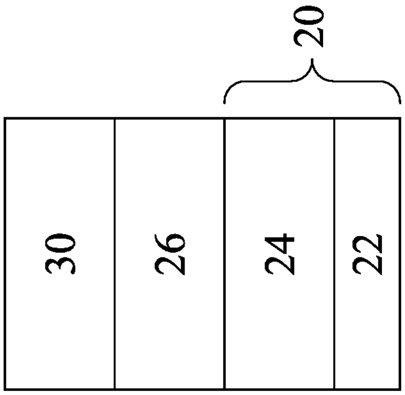

In this embodiment, however, a thermal process is not employed to compensate for the internal stress of mask layer 26. Rather, as illustrated in FIG. 4*b*, a stress compensation layer 30 is deposited on atop mask layer 26. As will be described in more detail below, stress compensation layer 30 provides an opposite or counteracting stress to mask layer 26 to reduce or eliminate distortion to mask layer 26 once it is patterned. In one exemplary embodiment, stress compensation layer 30 is a silicon nitride layer formed to a thickness of from about 200 Å to about 600 Å.

Figure 4C:
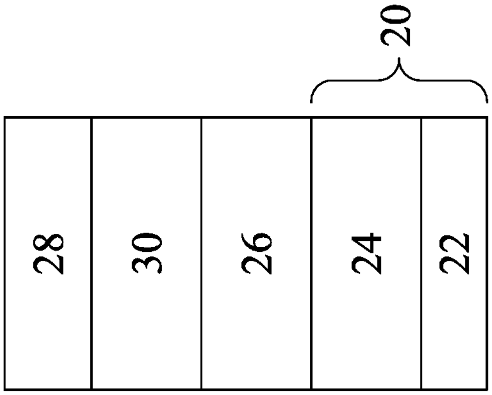
Figure 4D:
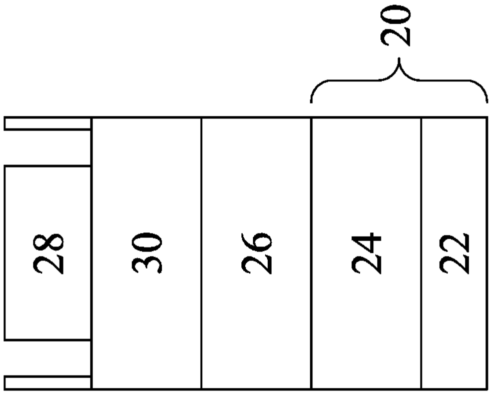

Continuing with the process, FIG. 4*c* illustrates the stage in manufacturing where a layer of photoresist material 28 has been deposited on stress compensation layer 30. One skilled in the art will be familiar with photoresist materials and their application and use, and hence details of same are not included herein for the sake of brevity. The teachings herein are applicable across the broad range of photoresists including commercially available photoresists, positive resists, negative resists, and the like. In the exemplary embodiment illustrated in FIGS. 4*a* through 4*h*, photoresist layer 28 is deposited using conventional techniques to a thickness of, for example, from about 500 Å to about 2000 Å. Next, as illustrated in FIG. 4*d*, photoresist layer 28 is patterned. This can be done using known photolithographic techniques, for example, or perhaps using ion beam or electron beam lithography or other such techniques.

Figure 4E:
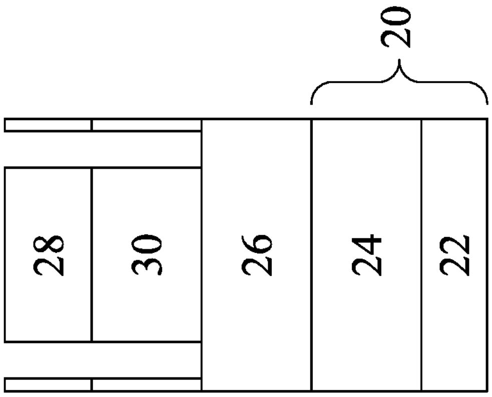

FIG. 4*e* illustrates the device in the stage of manufacturing when stress compensation layer 30 is patterned using the patterned photoresist layer 28 as a mask. In the embodiment wherein stress compensation layer 30 is silicon nitride, for instance, a wet etch such as by hot phosphoric acid ($H_3PO_4$), or the like can be employed. Alternatively, a dry etch such as a plasma etch using $CF_4$, $SF_6$, $NF_3$, or the like could be employed. Other alternative etch processes and etchants can be derived through routine experimentation once informed by the present disclosure.

Figure 4F:
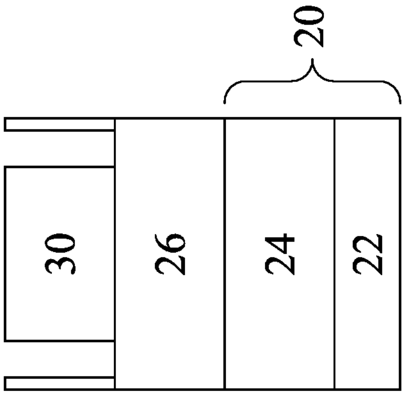

In FIG. 4*f*, remaining photoresist layer 28 has been removed after stress compensation layer 30 has been patterned. Depending upon the composition and materials of the layers and the specifics of the etch process, some or all of photoresist layer 28 might be removed during the patterning step illustrated by FIG. 4*e*. In most instances, however, some of photoresist layer 28 will remain. This remaining layer can be removed, such as by stripping, ashing, oxygen plasma, and the like. In yet other embodiments, remaining photoresist layer 28 can be left on patterned stress compensation layer 30 and removed in some subsequent process step (not illustrated).

Figure 4G:
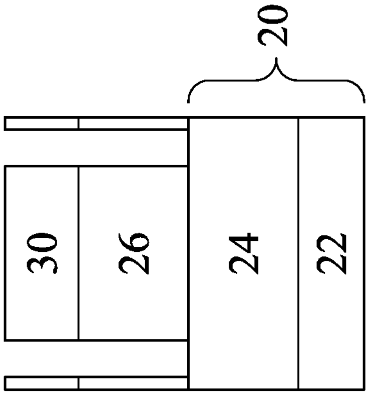

Next, as illustrated in FIG. 4*g*, the patterning continues to mask layer 26, in this instance using stress compensation layer 30 as the pattern. While mask layer 26 and stress compensation layer 30 could both be etched in the same etching chamber, one skilled in the art will recognize that different etch chemistry and parameters are required to etch the two respective layers, given their different material compositions. In some embodiments, the two layers are etched in two separate chambers. Because mask layer 26 and stress compensation layer 30 have opposite internal stresses that counteract one another (see step 6 of FIG. 1), the layers act to maintain fidelity to the pattern and to not suffer from twisting and distortion when they are patterned.

Figure 4H:
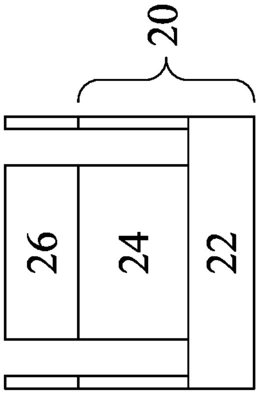

Collectively mask layer 26 and stress compensation layer 30 act as a masking layer for the subsequent etching of layer 24, as illustrated in FIG. 4*h*. In the embodiment wherein layer 24 is a polysilicon layer, various etch processes are known, such as a wet etch with, e.g., a $HNO_3$-based chemistry, a dry etch using, e.g., a fluorine-based or chlorine-based chemistry, and the like. While the particulars of the polysilicon etch process are not directly relevant to the present teaching, one skilled in the art will recognize that it is desirable to have a relatively high degree of etch selectivity between the layer 24 (such as polysilicon in this representative embodiment) and at least one of and preferably both mask layer 26 and stress compensation layer 30.

After the step illustrated by FIG. 4*h*, processing can continue, such as by in some instances removing stress compensation layer 30 and mask layer 26, and subsequently depositing one or more additional layers over patterned layer 24. In yet other embodiments, one or both of stress compensation layer 30 and mask layer 26 may remain and be incorporated into the resulting structure. Additionally, while FIG. 4*g* illustrates the patterning of layer 24 to be an etch process, as addressed above, the term patterning used herein is intended to be interpreted broadly enough to encompass numerous processes, including etching, selectively doping, selectively growing material on, and the like.

Figure 5A:
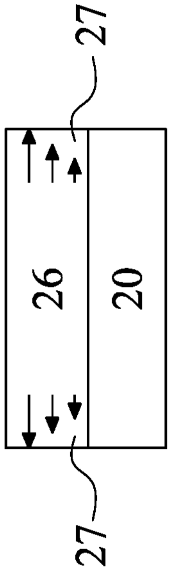
Figure 5B:
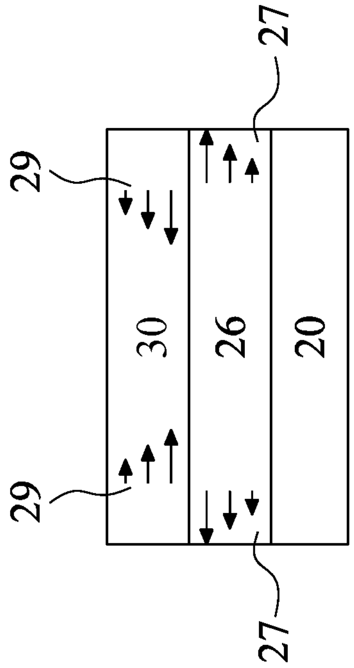
Figure 5C:
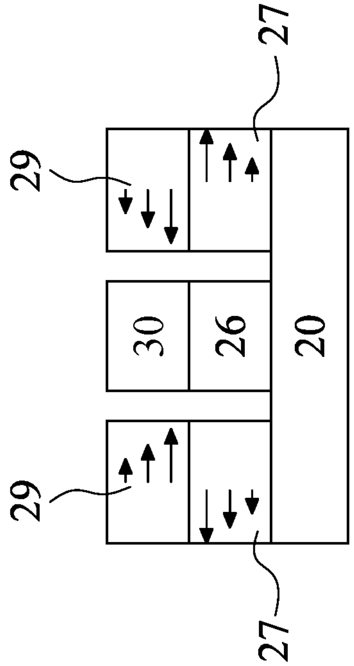

Turning now to FIGS. 5*a* through 5*c*, further details are provided for this embodiment of the stress compensation process. In this view, layer 24 and underlying structure 22 are not shown separately, but rather are illustrated collectively by substrate 20. FIG. 5*a* illustrates the state wherein mask layer 26 is deposited on substrate 20. In this representative embodiment, mask layer 26 is silicon oxide and as deposited mask layer 26 has an internal stress. For a typical oxide mask layer deposited in a thickness range of from about 600 Å to about 1200 Å, the internal stress could be a compressive stress of around 300 MPa, for example. This internal stress is schematically illustrated by arrows 27 in FIG. 5*a*.

Next, as illustrated by FIG. 5*b*, stress compensation layer 30 is deposited on mask layer 26. In one example, stress compensation layer 30 is a silicon nitride layer deposited to a thickness of from about 200 Å to about 600 Å, and deposited in such a manner as to have a tensile internal stress—which is the opposite of the compressive internal stress extant in mask layer 26. Techniques and parameter adjustment for stress engineering of stress compensation layer 30 is within the grasp of those skilled in the art and need not be addressed in detail herein. Briefly, however, it will be appreciated that the level of the tensile stress can be varied by a number of factors including the thickness of the film. In an embodiment, stress compensation layer 30 is deposited by a CVD process where the relative reactant flow rates, deposition pressure, and temperature may be varied to vary a composition of the dielectric layer thereby controlling the level of either tensile or compressive stress. For example, a silicon nitride (e.g., SiN, $Si_xN_y$) or silicon oxynitride (e.g., $Si_xON_y$) layer, where the stoichiometric proportions x and y may be selected according to CVD process variables as are known in the art to achieve a desired tensile or compressive stress in a deposited dielectric layer. For example, the CVD process may be a low pressure chemical vapor deposition (LPCVD) process, an atomic layer CVD (ALCVD) process, or a plasma enhanced CVD (PECVD) process.

According to some embodiments, stress compensation layer 30 is deposited at a temperature lower than a recrystallization temperature of the polysilicon layer 24. For example, although the precise recrystallization temperature is dependent on the level and type of doping, deposition at a temperature of less than about 600° C. is generally sufficient to prevent recrystallization of the amorphous polysilicon gate electrode portions. Conventional CVD precursors such as, silane ($SiH_4$), disilane ($Si_2H_6$) dichlorosilane ($SiH_2Cl_2$), hexacholorodisilane ($Si_2Cl_6$), BTBAS and the like, may be advantageously used in the CVD process to form the stress compensation layer.

For example, a low temperature LPCVD process for forming a tensile stress nitride dielectric layer includes supplying hexacholorodisilane (HCD) ($Si_2Cl_6$) and $NH_3$ gaseous precursors deposited at a temperature of from about 400° C. to about 600° C. at a pressure of about 0.1 Torr to about 10 Torr. An $NH_3$ to HCD volumetric gas ratio is from about 0.1 to about 500 with a stress increasing with an increasing volumetric ratio.

For example, a low temperature PECVD process for forming a compressive stress nitride layer may include supplying silane ($SiH_4$) and $NH_3$ gaseous precursors at a deposition temperature of from about 300° C. to about 600° C. carried out at pressures of from about 50 mTorr to about 5 Torr and RF powers of from about 100 Watts to about 3000 Watts. The RF power frequency is from about 50 KHz to about 13.56 MHz. Compressive stress increases with increasing power and frequency. Of course, the above embodiments are merely examples and are not intended to define or otherwise restrict or limit the scope of this disclosure. Tensile stress in the range of from about 600 MPa to about 1200 MPa are readily obtainable using such techniques as described above.

Returning now to FIG. 5*b*, the internal tensile stress of stress compensation layer 30 is schematically illustrated by arrows 29. As shown schematically, the tensile stress (arrows 29) of stress compensation layer 30 offset and compensate for the compressive stress (arrows 27) of mask layer 26. Then, as illustrated in FIG. 5*c*, when stress compensation layer 30 and mask layer 26 are subsequently patterned (using, e.g., the process steps illustrated in FIGS. 4*b* through 4*g*), the offsetting of internal stress means that the patterned layers do not twist or distort or otherwise suffer from degradation of resolution and pattern fidelity that would otherwise arise. In this way, closer tolerances for minimum feature size, pitch, and spacing can be realized.

One skilled in the art will recognize that the scope of the present disclosure is not limited to an oxide mask layer having compressive stress being compensated for by a nitride layer having tensile stress. For instance, a nitride mask layer having compressive stress could be compensated for by another nitride layer having tensile stress. Likewise, a nitride mask layer having tensile stress could be compensated for by another nitride layer having compressive stress. Alternatively, an oxide stress compensation layer could be used to compensate for a nitride hard mask, whether under compressive or tensile stress. Furthermore, the thermal process embodiments and the stress offsetting embodiments are not mutually exclusive—with embodiments envisioned in which thermal processes are used on one or more layers having differing stress orientations.

Figure 6A:
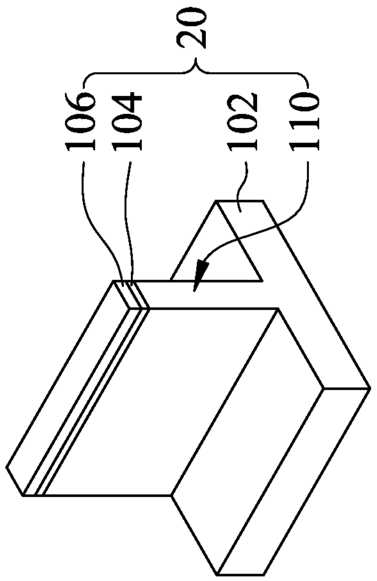
Figure 6B:
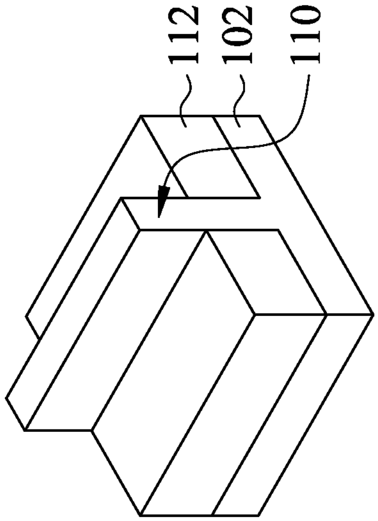
Figure 6C:
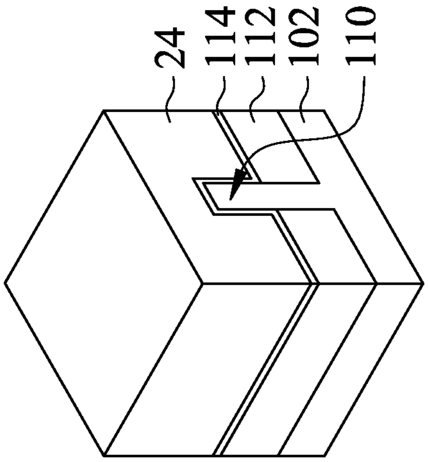

Turning now to FIGS. 6*a* through 6*f*, a representative embodiment for forming a semiconductor device such as a FinFET is illustrated. FIGS. 6*a* through 6*c* provide details of step 1 of FIG. 1, forming a substrate. In this case, substrate 20 includes a fin structure 110 formed arising from a semiconductor layer 102. Layers 104 and 106 are artifacts of the fin formation process and are subsequently removed, as shown in FIG. 6*b*. Also shown in FIG. 6*b* is the formation of insulating regions, such as STI regions 112 surrounding lower portions of fin structure 110. These structures and the steps for forming same will be known to those skilled in the art. Finally, as shown in FIG. 6*c*, oxide layer 114 and layer 24 are formed over fin structure 110. In this example, layer 24 which corresponds to the layer 24 illustrated in FIGS. 2*a* through 2*f* and FIGS. 4*a* through 4*h*, is a layer of polysilicon.

Figure 6D:
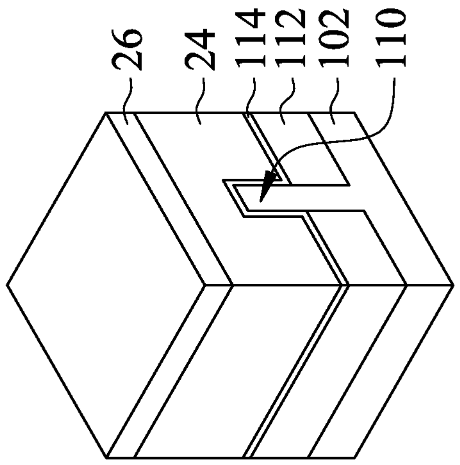
Figure 6E:
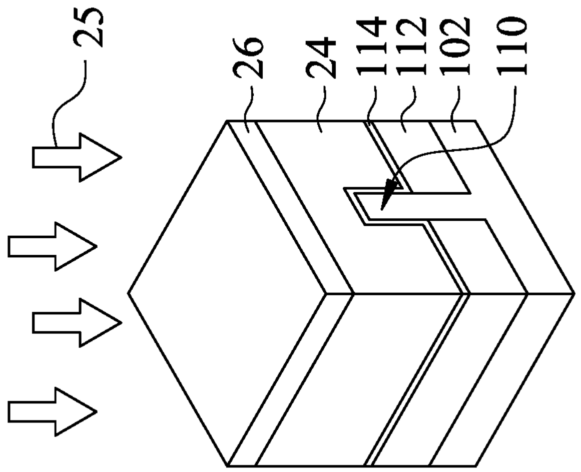
Figure 6F:
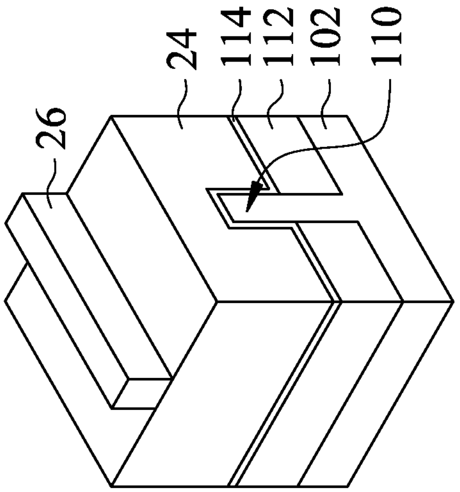

Continuing with FIG. 6*d*, mask layer 26 is deposited on layer 24, corresponding to mask layer 26 illustrated in FIG. 2*a*. As such, mask layer 26 has internal stress associated with it as was discussed above. FIG. 6*e* schematically illustrates thermal process (arrows 25) wherein mask layer 26 is subjected to a heat treatment, such as one or more of the heat treatments discussed above, to reduce or eliminate the internal stress. As was discussed above, this thermal process relaxes or otherwise reduces the internal stress of the mask layer. In this way, mask layer 26 is less subject to twisting and distortion when the layer is patterned into fine features, as shown in FIG. 6*f*. This patterned mask layer 26 is then used as a mask for patterning (etching, etc.) underlying layer 24. Note that the formation and patterning of photoresist layer 28 is not illustrated in FIG. 6*f*, although one skilled in the art will recognize these steps will be employed, as described above, to pattern mask layer 26. Then, layer 24 can be patterned using patterned mask layer 26 as a pattern, resulting in a gate electrode (or a dummy gate electrode for a replacement gate process) for the FinFET device that will result (not shown).

Although not illustrated, one skilled in the art will recognize that the stress offsetting process illustrated in FIGS. 4*a* through 4*h* and FIGS. 5*a* through 5*c* could be used in lieu of the thermal process illustrated in FIG. 6*e*. In that case, a stress compensation layer, such as layer 30 described above, can be employed to provide for an opposite compensating stress (e.g., a tensile stressed layer over a compressive stress mask layer, or a compressive stress layer over a tensile stressed mask layer).

Figure 7B:
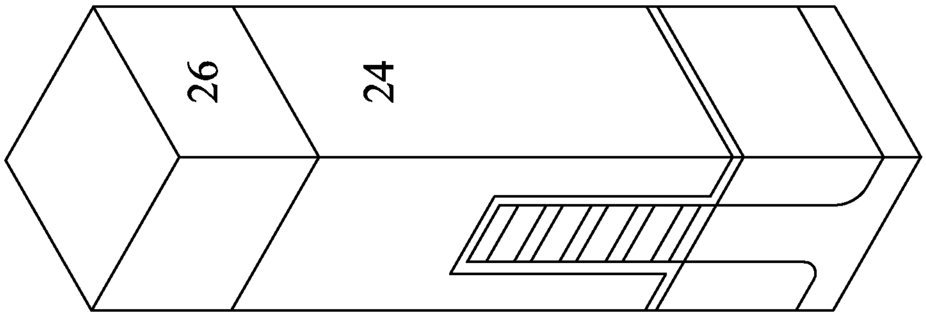
Figure 7A:
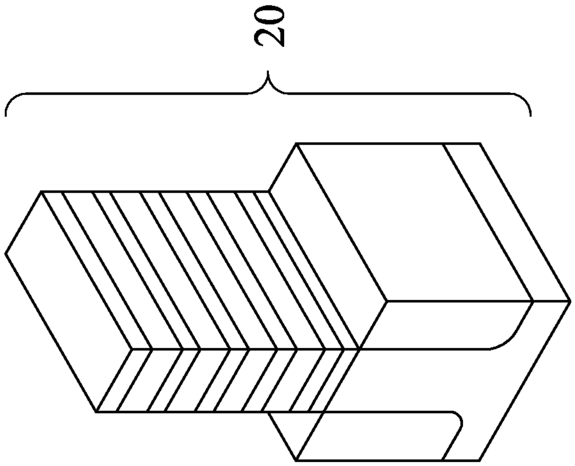
Figure 7D:
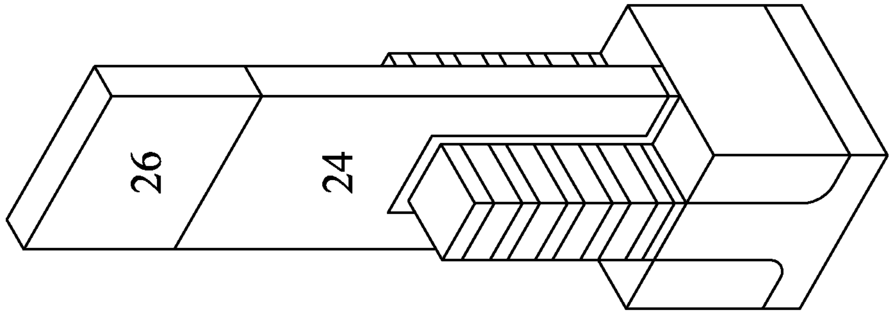
Figure 7C:
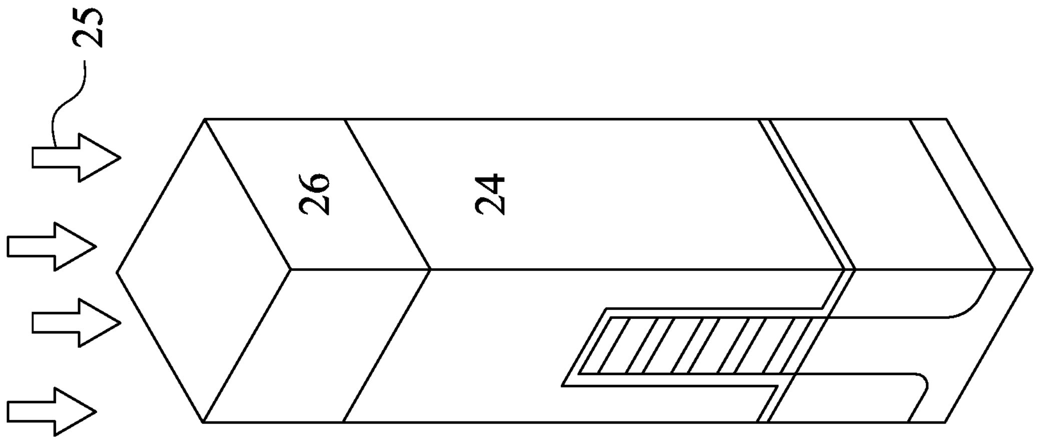
Figure 8B:
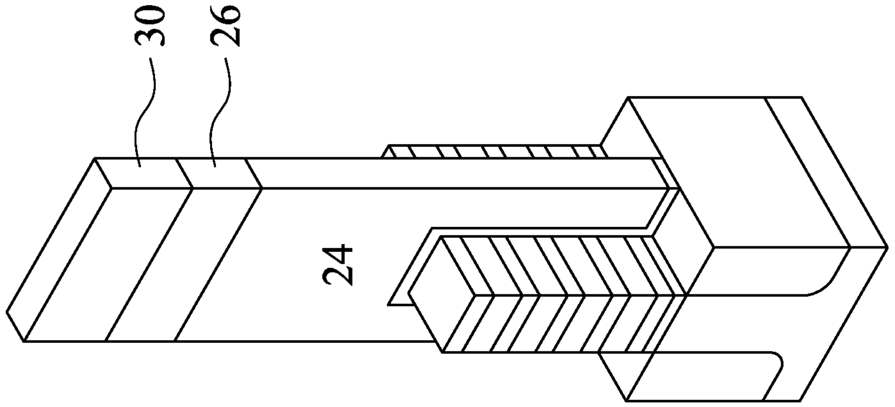
Figure 8A:
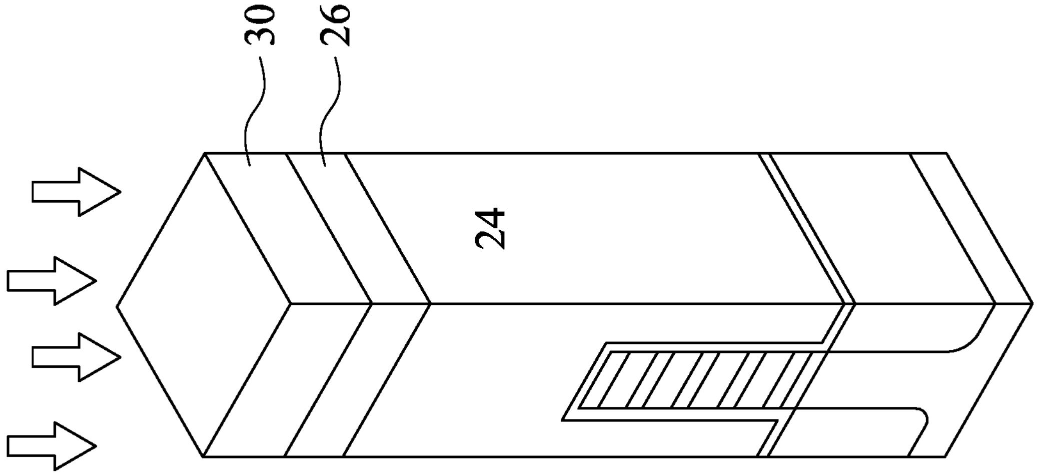

Turning now to FIGS. 7*a* through 7*d*, a representative embodiment for forming a semiconductor device such as a Gate All Around (GAA) transistor is illustrated. FIGS. 7*a* and 7*b* provide details of step 1 of FIG. 1, forming a substrate. In this case, substrate 20 includes a stacked structure of alternating layers of two different semiconductor structures, such as a stack of alternating layers of Si and SiGe. As shown in FIG. 7*b*, layer 24, again a polysilicon layer in this embodiment, is formed atop substrate 20, and mask layer 26 is formed on layer 24. Given the deep sub-micron sizes of most GAA transistors, such devices are particularly susceptible to distortion of the mask layer(s). Hence, it is particularly beneficial to ensure that internal and unbalanced stress in the mask layer 26 is eliminated or at least minimized. FIG. 7*c* illustrates an embodiment wherein a thermal process, schematically illustrated by arrows 25, is employed to reduce or eliminate stress in mask layer 26. As with other embodiments described herein, a stress compensation layer 30 could be used in lieu of or in supplement to the thermal process (arrows 25) shown in FIG. 7*c*. Such an embodiment is illustrated in FIG. 8*a*, which shows stress compensation layer 30 formed atop mask layer 26 (as more fully described in prior embodiments).

Returning to FIG. 7*d*, the results of patterning mask layer 26 (including, e.g., forming photoresist layer 28, patterning same, and the like, not illustrated) is provided wherein the resulting structure provides for a gate electrode or a dummy gate electrode for the GAA transistor being formed. Likewise, as shown in FIG. 8*b*, mask layer 26 together with stress compensation layer 30 can likewise be patterned with high resolution and fidelity to the original pattern.

Having been informed by the present disclosure, one skilled in the art will appreciate that numerous other transistor architectures (including planar transistors and multi-gate transistors) can be formed using the processes described herein and variations thereof. While layer 24 was described herein as polysilicon, the present disclosure is not limited to that material, nor is it limited to the materials identified for mask layer 26, stress compensation layer 30, etc. Additionally, the methods described herein could be repeated numerous times for many different layers during the processing of an integrated circuit, as those in the art will appreciate.

One general aspect of embodiments disclosed herein includes a method for forming a semiconductor device, forming a material layer over a substrate. The method also includes forming a mask layer over the material layer, the mask layer having an internal stress. The method also includes performing a stress-compensating process on the mask layer to adjust the internal stress of the mask layer.

Another general aspect of embodiments disclosed herein includes a method for forming a semiconductor device, depositing on a substrate a layer to be patterned. The method also includes depositing over the layer to be patterned a mask layer having an internal stress. The method also includes at least partially compensating for the internal stress of the mask layer. The method also includes patterning the mask layer after the step of at least partially compensating for the internal stress.

Yet another general aspect of embodiments disclosed herein includes a method of forming a semiconductor device, forming a material layer on a substrate. The method also includes depositing a mask layer on the material layer, the mask layer having an internal stress value. The method also includes reducing the internal stress value of the mask layer. The method also includes patterning the mask layer after the step of reducing the internal stress value of the mask layer.

One general aspect of embodiment disclosed herein includes a method for forming a semiconductor device, forming a mask layer over a substrate, the mask layer having, as deposited, an internal stress, the internal stress having a first magnitude and a first direction. The method also includes forming over the mask layer a stress-compensating layer, the stress compensating layer having an internal stress having a second magnitude and having a second direction opposite to the first direction. The method also includes performing a thermal process on the mask layer and the stress-compensating layer, where after the thermal process, the internal stress of the mask layer has a third magnitude lower than the first magnitude and has the first direction.

Some aspects of embodiments disclosed herein includes a method for forming a semiconductor device, forming a material layer over a substrate, where the method includes forming a mask layer over the material layer, the mask layer having, as deposited, an internal stress, the internal stress being either compressive or tensile, where the mask layer may include a material selected from the group may include of silicon oxide, silicon nitride, silicon-oxy-nitride, a metal nitride, and a metal oxide. The method also includes forming over the mask layer a stress-compensating layer, the stress compensating layer having an internal stress that is opposite in direction to the internal stress of the mask layer, where the stress-compensating layer reduces the internal stress of the mask layer. The method also includes performing a thermal process on the mask layer to further reduce the internal stress of the mask layer.

Other aspects of embodiment disclosed herein includes a method for forming a semiconductor device, the method including forming a material layer over a substrate. The method also includes forming a first mask layer over the material layer, the mask layer having an internal stress extending from a topmost surface of the mask layer to a bottommost surface of the mask layer, the internal stress being either compressive or tensile. The method also includes if the internal stress of the first mask layer is compressive: forming over the first mask layer a second mask layer having an internal stress that is tensile, where the second mask layer having an internal stress that is tensile at least partially offsets the compressive internal stress of the first mask layer, and performing a thermal process on the first mask layer to further offset the compressive internal stress of the first mask layer, where the first mask layer retains some compressive internal stress after the thermal process, and if the internal stress of the second mask layer is tensile: forming over the first mask layer a second mask layer having a compressive internal stress, where the second mask layer having an internal stress that is compressive at least partially offsets the tensile internal stress of the first mask layer, and performing a thermal process on the first mask layer to further offset the tensile internal stress of the first mask layer, where the first mask layer retains some tensile internal stress after the thermal process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming a mask layer on an underlying layer, wherein the mask layer has a first coefficient of thermal expansion (CTE), the underlying layer has a second CTE, and further wherein the first CTE and the second CTE are mismatched, the mask layer having, as deposited, an internal stress, the internal stress having a first magnitude and a first direction;

forming over the mask layer a stress-compensating layer, the stress compensating layer having an internal stress having a second magnitude and having a second direction opposite to the first direction; and performing a thermal process on the mask layer and the stress-compensating layer, wherein after the thermal process, the internal stress of the mask layer has a third magnitude lower than the first magnitude and has the first direction.

2. The method of claim 1 wherein the internal stress of the mask layer arises from at least one cause, the cause selected from the group consisting of a deposition process by which the mask layer was deposited, contact with a material underlying the mask layer, and a topography of the substrate.

3. The method of claim 1, wherein the underlying layer is polysilicon and the stress-compensating layer is deposited at a temperature below the polysilicon recrystallization temperature.

4. The method of claim 1, further comprising:

depositing a photoresist layer on the stress compensating layer;

photolithographically patterning the photoresist layer; and patterning the stress compensating layer through the patterned photoresist layer.

5. The method of claim 4, further comprising:

patterning the mask layer through the patterned stress compensating layer.

6. The method of claim 5, wherein the step of patterning the stress compensating layer is performed in a first etch chamber, and the step of patterning the mask layer is performed in a second etch chamber, different from the first etch chamber.

7. The method of claim 4, wherein the step of performing a thermal process is performed before the step of depositing a photoresist layer.

8. A method for forming a semiconductor device, comprising:

forming a material layer over a substrate;

forming a mask layer over the material layer, the mask layer having, as deposited, an internal stress, the internal stress being either compressive or tensile, wherein the mask layer comprises a material selected from the group consisting of silicon oxide, silicon nitride, silicon-oxy-nitride, a metal nitride, and a metal oxide;

forming over the mask layer a stress-compensating layer, the stress compensating layer having an internal stress that is opposite in direction to the internal stress of the mask layer, wherein the stress-compensating layer reduces the internal stress of the mask layer; and performing a thermal process on the mask layer to further reduce the internal stress of the mask layer, wherein the mask layer, as deposited, has a compressive internal stress and further wherein, after performing the thermal process, the mask layer remains in compressive internal stress.

9. The method of claim 8, wherein a top layer of the substrate comprises polysilicon, and wherein the stress compensating layer is deposited at a temperature below the recrystallization temperature of the polysilicon.

10. The method of claim 9, further comprising patterning the material layer using the mask layer as a pattern mask.

11. The method of claim 8, wherein the mask layer has a first coefficient of thermal expansion (CTE), and the mask layer is formed on an underlying layer having a second CTE, and wherein the first CTE and the second CTE are mismatched.

12. The method of claim 8, wherein the thermal process includes:

performing a temperature ramping process from room temperature to a thermal anneal temperature;

maintaining the thermal anneal temperature for a period from about 30 seconds to about one minute; and performing a second temperature ramping process from the thermal anneal temperature to room temperature.

13. The method of claim 8, wherein, as deposited, atoms of the mask layer have a first level of stability, and the thermal processes cause the atoms of the mask layer to migrate to positions with a level of stability greater than the first level of stability.

14. The method of claim 8, further comprising patterning the mask layer and the stress compensating layer using a photolithographic process.

15. A method for forming a semiconductor device, comprising:

forming a material layer over a substrate;

forming a first mask layer over the material layer, the first mask layer having an internal stress extending from a topmost surface of the first mask layer to a bottommost surface of the first mask layer, the internal stress being either compressive or tensile;

if the internal stress of the first mask layer is compressive:

forming over the first mask layer a second mask layer having an internal stress that is tensile, wherein the second mask layer having an internal stress that is tensile at least partially offsets the compressive internal stress of the first mask layer, and performing a thermal process on the first mask layer to further offset the compressive internal stress of the first mask layer, wherein the first mask layer retains some compressive internal stress after the thermal process, and if the internal stress of the second mask layer is tensile:

forming over the first mask layer a second mask layer having a compressive internal stress, wherein the second mask layer having an internal stress that is compressive at least partially offsets the tensile internal stress of the first mask layer, and performing a thermal process on the first mask layer to further offset the tensile internal stress of the first mask layer, wherein the first mask layer retains some tensile internal stress after the thermal process.

16. The method of claim 15, further comprising:

forming a transistor channel region; on the substrate;

forming a dielectric layer on the channel regions;

depositing the material layer to overlie at least three sides of the channel region, wherein the material layer comprises polysilicon; and patterning the material layer, using the first mask layer as a patterning mask, to form a gate structure.

17. The method of claim 16, wherein the second mask layer is deposited at a temperature below the polysilicon recrystallization temperature.

18. The method of claim 15, further comprising etching the first mask layer in a first chamber and etching the second mask layer in a second etch chamber different from the first etch chamber.

19. The method of claim 18, wherein the second mask layer acts as a patterning mask when etching the first mask layer.

20. The method of claim 15, further comprising patterning the first mask layer, wherein the first mask layer experiences a level of distortion, after patterning, that is lower than a level of distortion that would have occurred in the absence of the second mask layer.

* * * * *